United States Patent
Stirton et al.

(10) Patent No.: US 6,451,700 B1
(45) Date of Patent: Sep. 17, 2002

(54) METHOD AND APPARATUS FOR MEASURING PLANARITY OF A POLISHED LAYER

(75) Inventors: James Broc Stirton, Austin, TX (US); Kevin R. Lensing, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/843,001

(22) Filed: Apr. 25, 2001

(51) Int. Cl.[7] .................. H01L 21/311; H01L 21/461
(52) U.S. Cl. .................. 438/695; 438/691; 438/692; 438/759; 356/632
(58) Field of Search .................. 438/695, 691, 438/692, 759; 356/632

(56) References Cited

U.S. PATENT DOCUMENTS

| | | | | |
|---|---|---|---|---|
| 5,555,474 A | * | 9/1996 | Ledger | 356/381 |
| 6,122,064 A | * | 9/2000 | Banet et al. | 356/381 |
| 6,142,855 A | * | 11/2000 | Nyui et al. | 451/67 |
| 6,276,989 B1 | * | 8/2001 | Campbell et al. | 451/10 |

* cited by examiner

*Primary Examiner*—Alexander Ghyka
(74) *Attorney, Agent, or Firm*—Williams, Morgan & Amerson, P.C.

(57) ABSTRACT

A method for polishing wafers includes providing a wafer having a grating structure and a process layer formed over the grating structure; illuminating at least a portion of the process layer and the grating structure with a light source; measuring light reflected from the illuminated portion of the process layer and the grating structure to generate a reflection profile; and determining planarity of the process layer based on the reflection profile. A metrology tool adapted to receive a wafer having a grating structure and a process layer formed over the grating structure includes a light source, a detector, and a data processing unit. The light source is adapted to illuminate at least a portion of the process layer overlying the grating structure. The detector is adapted to measure light reflected from the illuminated portion of the process layer and the grating structure to generate a reflection profile. The data processing unit is adapted to determine planarity of the process layer based on the generated reflection profile.

16 Claims, 5 Drawing Sheets

US 6,451,700 B1

METHOD AND APPARATUS FOR MEASURING PLANARITY OF A POLISHED LAYER

BACKGROUND OF THE INVENTION

1. Field of the Invention

This invention relates generally to the field of semiconductor device manufacturing and, more particularly, to a method and apparatus for measuring planarity of a polished layer.

2. Description of the Related Art

Chemical mechanical polishing (CMP) is a widely used means of planarizing silicon dioxide as well as other types of layers on semiconductor wafers. Chemical mechanical polishing typically utilizes an abrasive slurry disbursed in an alkaline or acidic solution to planarize the surface of the wafer through a combination of mechanical and chemical action. Generally, a chemical mechanical polishing tool includes a polishing device positioned above a rotatable circular platen or table on which a polishing pad is mounted. The polishing device may include one or more rotating carrier heads to which wafers may be secured, typically through the use of vacuum pressure. In use, the platen may be rotated and an abrasive slurry may be disbursed onto the polishing pad. Once the slurry has been applied to the polishing pad, a downward force may be applied to each rotating carrier head to press the attached wafer against the polishing pad. As the wafer is pressed against the polishing pad, the surface of the wafer is mechanically and chemically polished.

As semiconductor devices are scaled down, the importance of chemical mechanical polishing to the fabrication process increases. In particular, it becomes increasingly important to control and minimize within-wafer topography variations. For example, in one embodiment, to minimize spatial variations in downstream photolithography and etch processes, it is necessary for the oxide thickness of a wafer to be as uniform as possible (i.e., it is desirable for the surface of the wafer to be as planar as possible).

Those skilled in the art will appreciate that a variety of factors may contribute to producing variations across the post-polish surface of a wafer. For example, variations in the surface of the wafer may be attributed to drift of the chemical mechanical polishing device. Typically, a chemical mechanical polishing device is optimized for a particular process, but because of chemical and mechanical changes to the polishing pad during polishing, degradation of process consumables, and other processing factors, the chemical mechanical polishing process may drift from its optimized state.

Typically, the operating recipes for polishing tools are determined during the process characterization stage, because no in-line techniques are readily available for determine planarity of the polished surface. Based on design factors, such as the topology of the underlying features and the thickness of the layer to be polished, polishing targets are generated to help ensure that the polishing time is sufficient to planarize the process layer being polished without overpolishing and damaging the underlying structures. FIG. 1A illustrates a cross-section of an exemplary semiconductor device 100 that is subjected to a planarization process. The semiconductor device 100 includes a plurality of transistor gate electrode stacks 110 formed on a substrate 120. For clarity and ease of illustration, not all features of the transistors (e.g., source/drain regions, isolation structures, etc.) are shown. An inter-layer dielectric (ILD) layer 130 is formed over the transistor gate electrode stacks 110. Typically, the ILD layer 130 is a layer of silicon dioxide formed using tetraethoxysilane (TEOS) or fluorine doped tetraethoxysilane (F-TEOS). The ILD layer 130 is polished to planarize a surface 135 of the ILD layer 130, as shown in FIG. 1B. If the ILD layer 130 is underpolished, the surface 135 will not be completely planar, which may interfere with formation of features in subsequent layers. If the ILD layer 130 is overpolished, the underlying features (e.g., the gate electrode stacks 110) may be damaged or the insulative capability of the ILD layer 130 may be reduced.

Another exemplary process layer that is commonly subjected to a polishing operation is a layer of silicon dioxide used to fill shallow trench isolation (STI) structures formed in the substrate between active devices (e.g., transistors) in the semiconductor device. The silicon dioxide layer is formed over a silicon nitride stop layer. The silicon dioxide layer is polished to remove portions that are not disposed in the isolation trenches. The silicon nitride layer serves as a buffer layer to protect the silicon substrate during the polishing process. The polishing process is designed to polish away all of the silicon dioxide layer and a portion of the silicon nitride stop layer. Portions of the silicon nitride stop layer remaining after the polishing process are removed by a stripping process. If the device is overpolished, all of the silicon nitride stop layer may be removed and the silicon substrate may be damaged. If the device is underpolished, not all of the silicon dioxide may be removed, which may interfere with the stripping of the silicon nitride stop layer The present invention is directed to overcoming, or at least reducing the effects of, one or more of the problems set forth above.

SUMMARY OF THE INVENTION

One aspect of the present invention is seen in a method for polishing wafers. The method includes providing a wafer having a grating structure and a process layer formed over the grating structure; illuminating at least a portion of the process layer and the grating structure with a light source; measuring light reflected from the illuminated portion of the process layer and the grating structure to generate a reflection profile; and determining at least one parameter of an operating recipe of a polishing tool based on the reflection profile.

Another aspect of the present invention is seen in a metrology tool adapted to receive a wafer having a grating structure and a process layer formed over the grating structure. The metrology tool includes a light source, a detector, and a data processing unit. The light source is adapted to illuminate at least a portion of the process layer overlying the grating structure. The detector is adapted to measure light reflected from the illuminated portion of the process layer and the grating structure to generate a reflection profile. The data processing unit is adapted to determine planarity of the process layer based on the generated reflection profile.

BRIEF DESCRIPTION OF THE DRAWINGS

The invention may be understood by reference to the following description taken in conjunction with the accompanying drawings, in which like reference numerals identify like elements, and in which.

Figure 1A:
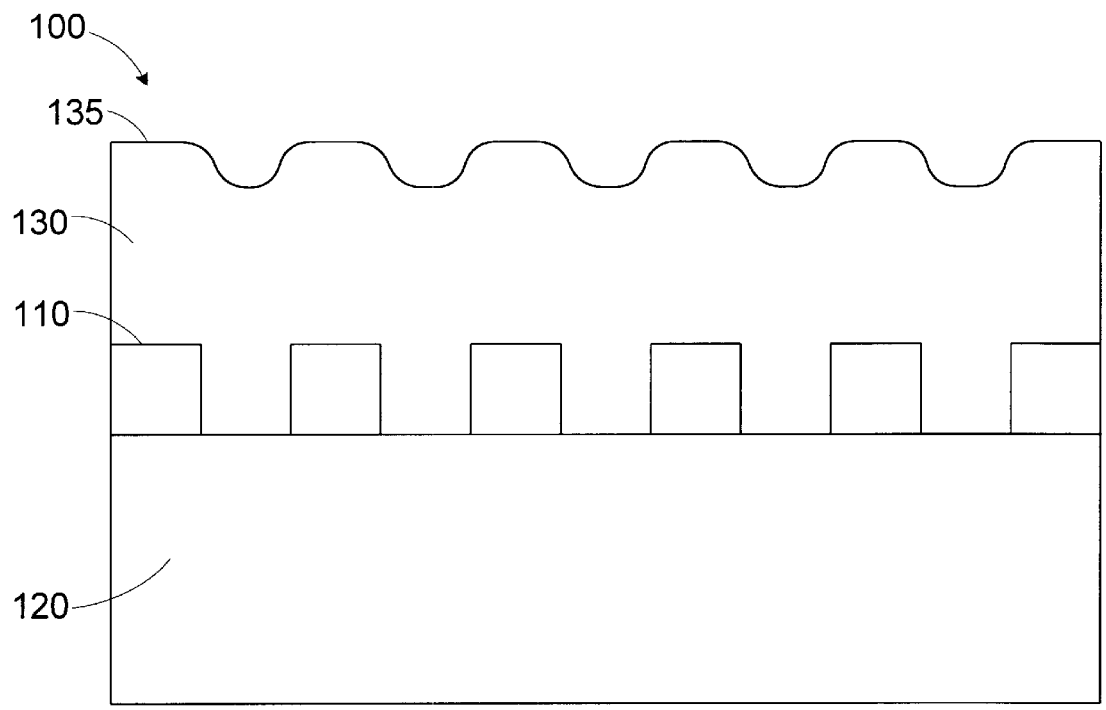
FIGS. 1A and 1B are cross sections of an exemplary semiconductor device on which a polishing process is performed.
Figure 1B:
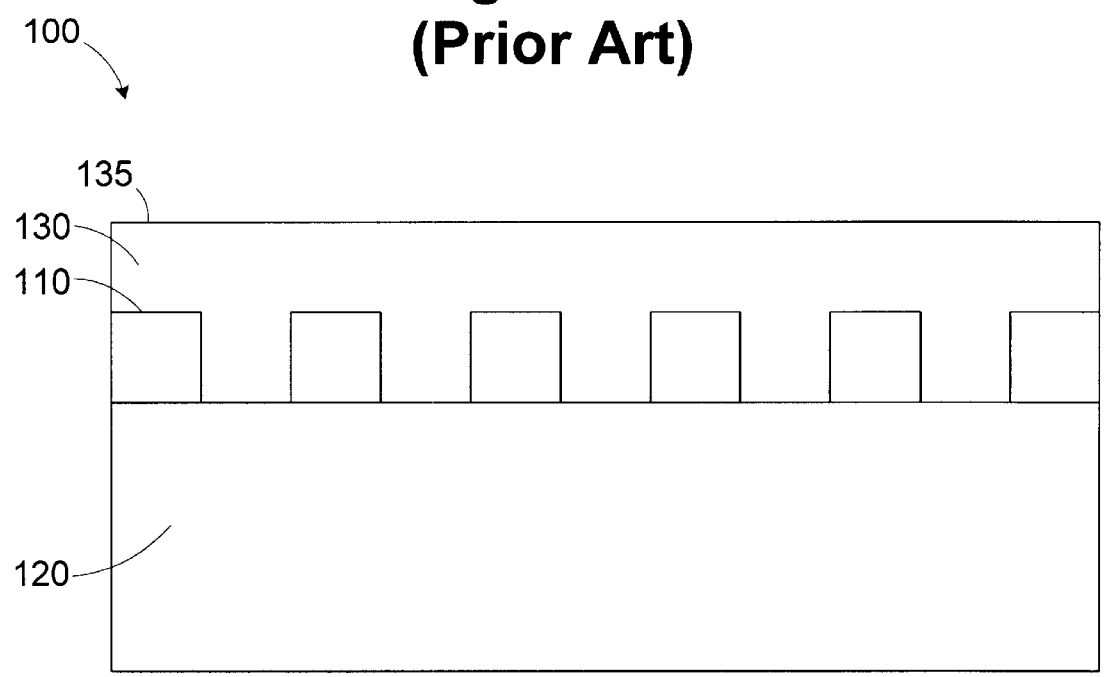

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
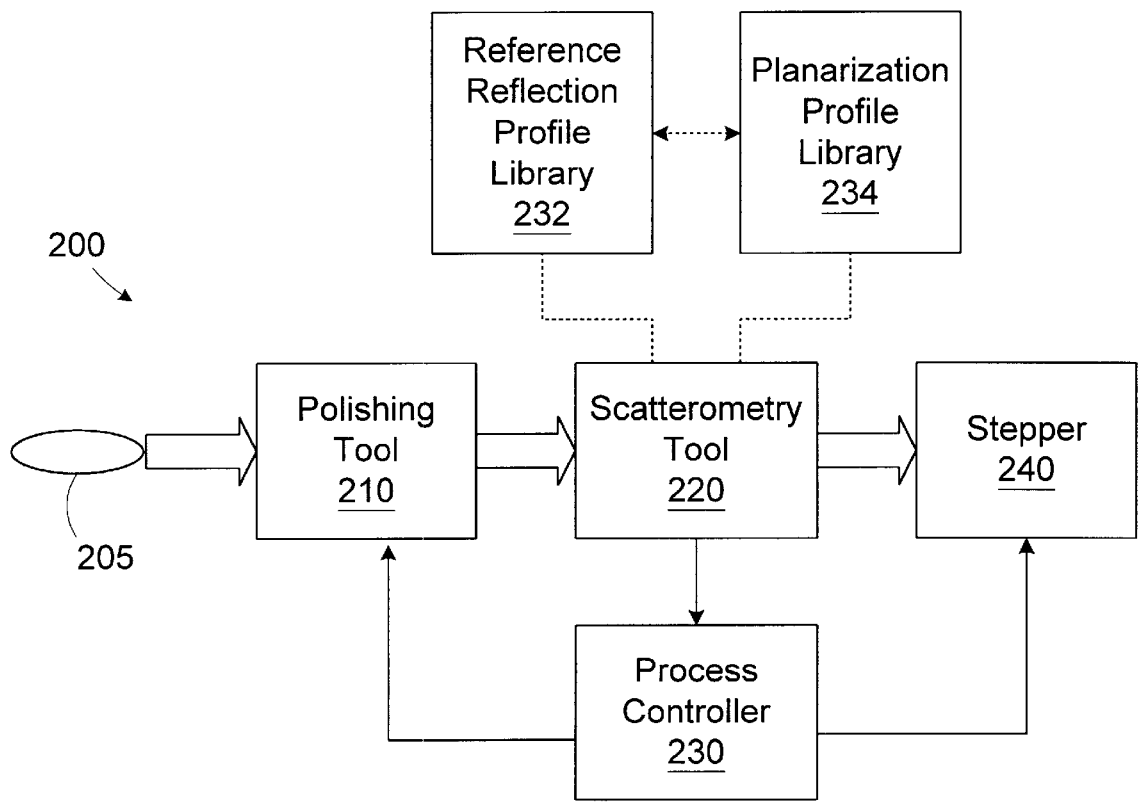
FIG. 2 is a simplified diagram of an illustrative processing line for processing wafers in accordance with one illustrative embodiment of the present invention.

Referring to FIG. 2, a simplified diagram of an illustrative processing line 200 for processing wafers 205 in accordance with one illustrative embodiment of the present invention is provided. The processing line 200 includes a polishing tool 210 for polishing the wafers 205 in accordance with a polishing recipe. The polishing tool 210 may be used to polish process layers formed on the wafer 205, such as the silicon dioxide and silicon nitride layers described above, metal layers, or other process layers. Variations in the polishing operations of the polishing tool 210 may cause corresponding variations in the post-polish surface of the wafer as previously described.

The processing line 200 includes a scatterometry tool 220 adapted to measure the planarity of the polished process layer on the wafer as described in greater detail below in reference to FIGS. 3, 4A, 4B, and 4C. In general, the scatterometry tool 220 includes optical hardware, such as an ellipsometer or reflectometer, and a data processing unit loaded with a scatterometry software application for processing data collected by the optical hardware. For example, the optical hardware may include a model OP5230 or OP5240 with a spectroscopic ellipsometer offered by Thermawave, Inc. of Freemont Calif. The data processing unit may comprise a profile application server manufactured by Timbre Technologies, a fully owned subsidiary of Tokyo Electron America, Inc. of Austin, Tex. and distributed by Thermawave, Inc. The scatterometry tool 220 may be external to the polishing tool 210 or, alternatively, the scatterometry tool 220 may be installed in an in-situ arrangement, where planarity measurements may be taken during the polishing process.

A process controller 230 is provided for receiving the planarization information determined by the scatterometry tool 230 and providing feedback to the polishing tool 210 to adjust its operating recipe to improve the uniformity of the polishing process and reduce polishing variation for subsequently polished wafers 205.

In the illustrated embodiment, the process controller 230 is a computer programmed with software to implement the functions described. However, as will be appreciated by those of ordinary skill in the art, a hardware controller designed to implement the particular functions may also be used. Moreover, the functions performed by the process controller 230, as described herein, may be performed by multiple controller devices distributed throughout a system. Additionally, the process controller 230 may be a standalone controller, it may be integrated into a tool, such as the polishing tool 210 or he scatterometry tool 220, or it may be part of a system controlling operations in an integrated circuit manufacturing facility.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 230, as described, is the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699 Provisional Specification for CIM Framework Domain Architecture) and APC (SEMI E93-0999 Provisional Specification for CIM Framework Advanced Process Control Component) specifications are publicly available from SEMI.

In one embodiment, the scatterometry tool 220 measures the planarity of process layers formed in production devices. In some cases, the geometry of the features or the presence of underlying structures may inhibit scatterometry measurements. Accordingly, test structures having the same general configuration as features of the production devices formed on the wafer 205 may be employed. The test structures may be formed in a region of the wafer 205 not normally used for forming devices (e.g., in the periphery region where identification codes are typically scribed or in the scribe lines between production die).

Figure 3:
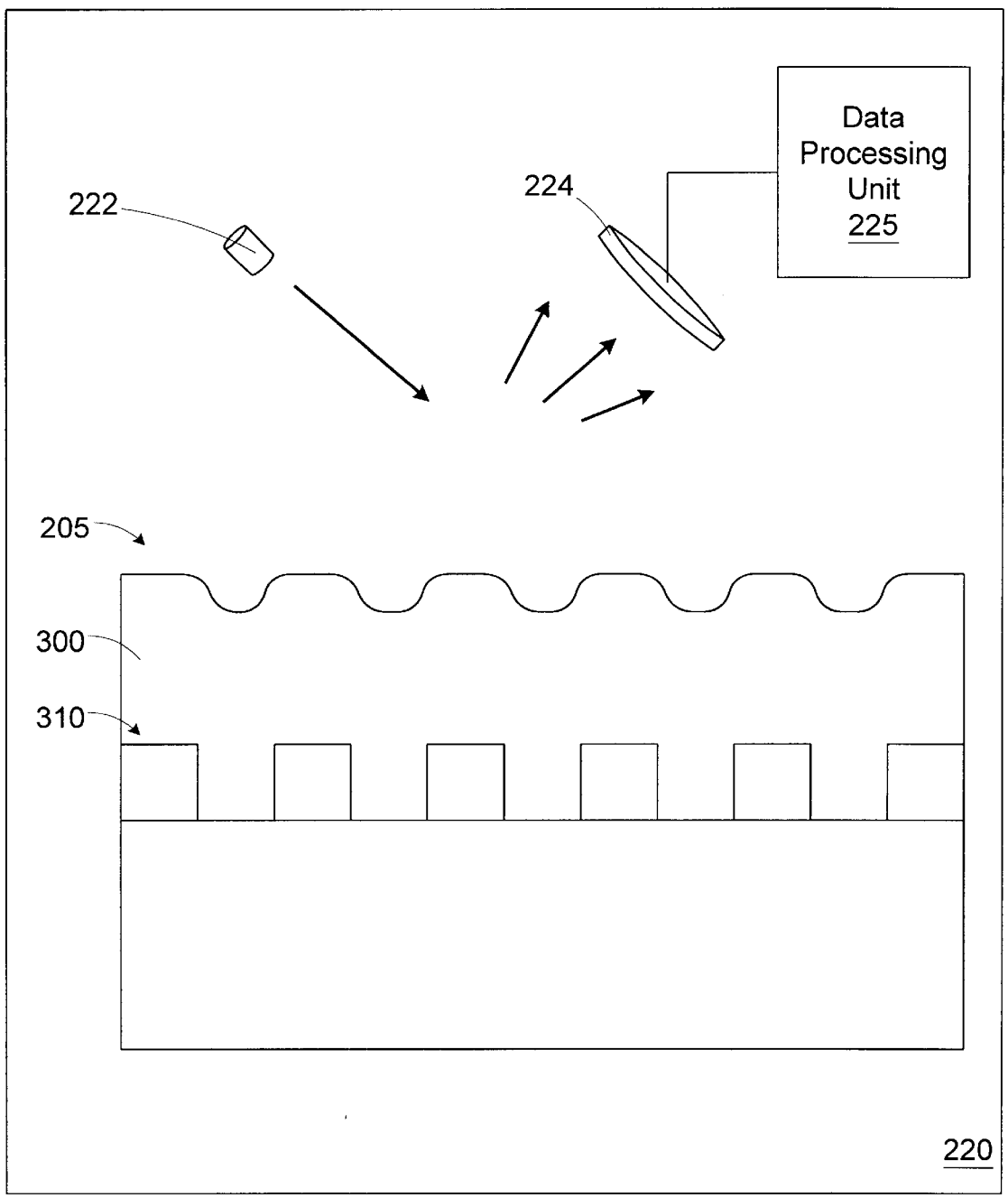
FIG. 3 is a simplified view of the scatterometry tool of FIG. 3 loaded with a wafer.

Turning now to FIG. 3, a simplified view of the scatterometry tool 220 loaded with a wafer 205 having a process layer 300 is provided. In the illustrated embodiment, the process layer 300 is formed over a grating structure 310, such as active devices or trenches or a test structure). The scatterometry tool 220, includes a light source 222 and a detector 224 positioned proximate the process layer 300. The light source 222 of the scatterometry tool 220 illuminates at least a portion of the process layer 300, and the detector 224 takes optical measurements, such as intensity or phase, of the reflected light. A data processing unit 225 receives the optical measurements from the detector 224 and processes the data to determine the planarity of the process layer 300.

The scatterometry tool 220 may use monochromatic light, white light, or some other wavelength or combinations of wavelengths, depending on the specific implementation. The angle of incidence of the light may also vary, depending on the specific implementation. The light analyzed by the scatterometry tool 220 typically includes a reflected component (i.e., incident angle equals reflected angle) and a refracted component (i.e., incident angle does not equal the reflected angle). For purposes of discussion here, the term "reflected" light is meant to encompass both components.

Variations in the process layer 300 caused by polishing variations or incomplete polishing causes changes in the reflection profile (e.g., intensity vs. wavelength—tan(δ), phase vs. wavelength—sin(ψ), where δ and ψ are common scatterometry outputs known to those of ordinary skill in the art) measured by the scatterometry tool 220 as compared to the light scattering profile that would be present in a completely planar wafer.

Figure 4A:
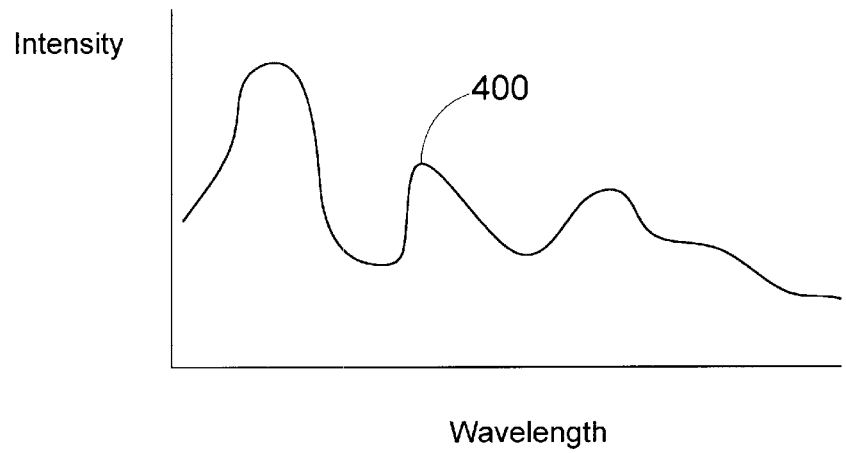
FIGS. 4A, 4B, and 4C illustrate a library of exemplary scatterometry curves used to characterize the wafer measured in the scatterometry tool of FIG. 4.
Figure 4B:
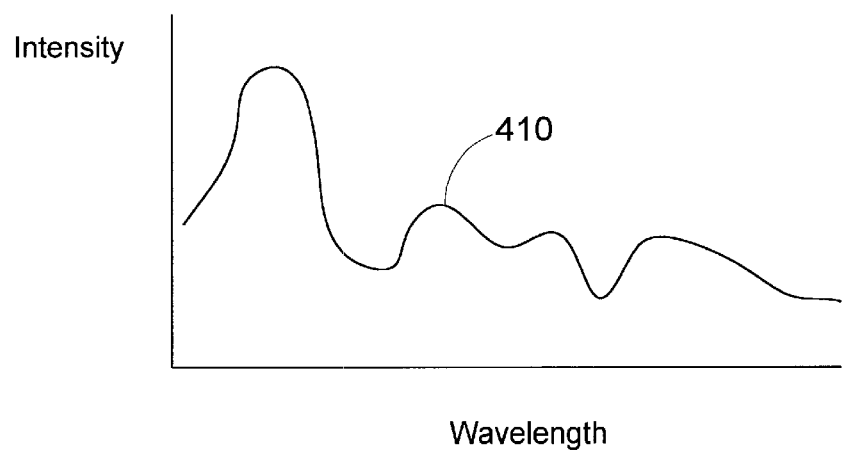
Figure 4C:
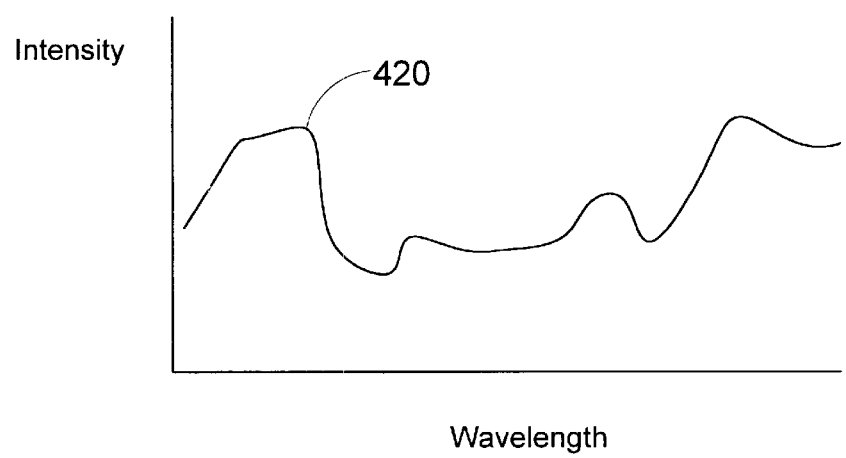

FIGS. 4A, 4B, and 4C illustrate exemplary reflection profiles 400, 410, 420 that may be included in a reference reflection profile library 232 (see FIG. 2) used by the data processing unit 225 to characterize the planarity of the process layer 300 based on the measured reflection profiles. The particular reflection profile expected for any structure depends on the specific geometry of the structure and the parameters of the measurement technique employed by the scatterometry tool 220 (e.g., light bandwidth, angle of incidence, etc.). The profiles in the reference reflection profile library 232 are typically calculated theoretically by employing Maxwell's equations based on the characteristics of the process layer 300 and underlying topology of the grating structure 310. The process for generating reference reflection profiles is well known to those of ordinary skill in the art, and accordingly, it is not described in greater detail herein for clarity and so as not to obscure the invention. For example, scatterometry libraries are commercially available from Timbre Technologies, Inc. The profiles in the reference reflection profile library 232 may also be generated empirically by measuring reflection profiles of sample wafers and subsequently characterizing the measured wafers by destructive or non-destructive examination techniques.

The reflection profile 400 of FIG. 4A represents an expected profile for an unpolished process layer 300. The reflection profile 410 of FIG. 4B represents an expected profile for a process layer that has been partially planarized. The reflection profile 420 of FIG. 4C represents an expected profile for a completely planarized process layer 300. The reflection profiles of process layers with varying degrees of planarization may be included in the reference reflection profile library 232.

The data processing unit 225 compares the measured reflection profile to the reference reflection profile library 232. Each reference profile has an associated polishing profile (e.g., overpolished or underpolished) and may be linked to a planarization profile library 234 (see FIG. 2). The data processing unit 225 determines the reference reflection profile having the closest match to the measured reflection profile. Techniques for matching the measured reflection profile to the closest reference reflection profile are well known to those of ordinary skill in the art, so they are not described in greater detail herein.

In another embodiment, the process controller 230 or other external controller (not shown) may be adapted to compare the measured reflection profile to the reference reflection profile library 232. In such a case, the scatterometry tool 220 would output the matching reference reflection profile, and the process controller 230 may link that reference reflection profile to an associated profile in the planarization profile library 234.

In another embodiment, the measured reflection profile may be compared to a target reflection profile selected from the reference reflection profile library 232 for a process layer 300 having a known and desired, or acceptable planarity. For example, a target reflection profile may be calculated for a process layer 300 having an ideal or acceptable planarization profile using Maxwell's equations, and that target reflection profile may be stored in the reference reflection profile library 232. Thereafter, the measured reflection profile of a process layer 300 having an unknown degree of planarity is compared to the target reflection profile. Based upon this comparison, a relatively rough approximation of the planarity may be determined. For example, the approximation may indicate an underpolish condition. That is, by comparing the measured reflection profile to the target reflection profile, the planarity of the process layer 300 may be approximated, such that further matching of the measured reflection profile with additional reference reflection profiles from the reference reflection profile library 232 is unwarranted. Using this technique, an initial determination may be made as to the planarity of the process layer 300. Of course, this step may be performed in addition to the matching or correlating of a measured reflection profile to a reference reflection profile from the reference reflection profile library 232 as described above.

After receiving the planarization profile from the scatterometry tool 220, the process controller 230 may take a variety of autonomous actions. In one embodiment of the present invention, the process controller 230 is adapted to modify the operating recipe of the polishing tool 210 based on the polishing profile assessments to control polishing operations on subsequent wafers processed by the polishing tool 210. The polishing profile assessment may also be used to rework the measured wafer 300 if the planarization process has not been adequately completed. After the measured light reflection profiles of the process layer 300 are correlated to a reference reflection profile in the reference reflection profile library 232 by the data processing unit 225, the process controller 230 uses the polishing profile information to provide feedback to the polishing tool 210 to reduce the polishing variation.

Various techniques are known to those of ordinary skill on the art for controlling polishing profiles of polishing tools 210. The process controller 230 may use a control model relating the measured polishing profile to a particular operating recipe parameter in the polishing tool 210 to control the polishing rate or polishing time to correct for any overpolishing or underpolishing. For example, the control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected.

Polishing models may be generated by the process controller 230, or alternatively, they may be generated by a different processing resource (not shown) and stored on the process controller 230 after being developed. The polishing models may be developed using the polishing tool 210 or using a different tool (not shown) having similar operating characteristics. For purposes of illustration, it is assumed that the polishing models are generated and updated by the process controller 230 or other processing resource based on the actual performance of the polishing tool 210 as measured by the scatterometry tool 220. The polishing models may be trained based on historical data collected from numerous processing runs of the polishing tool 210.

The scatterometry tool 220 may be used to measure planarity in various regions on the wafer (e.g., center, middle, periphery). For example, the same structure may be measured in various individual die defined on the wafer. Parameters such as polishing arm range of motion, polishing pressure, etc., may be adjusted to affect the rate at which polishing occurs at various places on the wafer corresponding to the locations measured by the scatterometry tool 220.

An exemplary technique for controlling polishing profile (e.g., center-fast or center-slow) is described in U.S. Patent Application No. 09/372,014, in the names of William Jarrett Campbell, Jeremy Lansford, and Christopher H. Raeder, entitled Method And Apparatus For Controlling Within-Wafer Uniformity In Chemical Mechanical Polishing, and incorporated herein by reference in its entirety.

Some polishing tools 210, such as an Auriga system offered by Speedfam-IPEC of Chandler, AZ, and a Teres CMP system offered by Lam Research, Inc. of Fremont, Calif., have use-selectable pressure zones at different places on the polishing surface that may be used to control polish rates in the corresponding regions of the wafer. A technique for controlling polishing profile (e.g., center-fast or center-slow) by adjusting pressure in these controllable zones is described in U.S. Patent Application No. XX/XXX,XXX (Attorney Docket No. 2000.067000/DIR, Client Docket No. TT4275), in the names of Alexander J. Pasadyn, Christopher H. Raeder, and Anthony J. Toprac, entitled "METHOD AND APPARATUS FOR POST-POLISH THICKNESS AND UNIFORMITY CONTROL," and incorporated herein by reference in its entirety.

Figure 5:
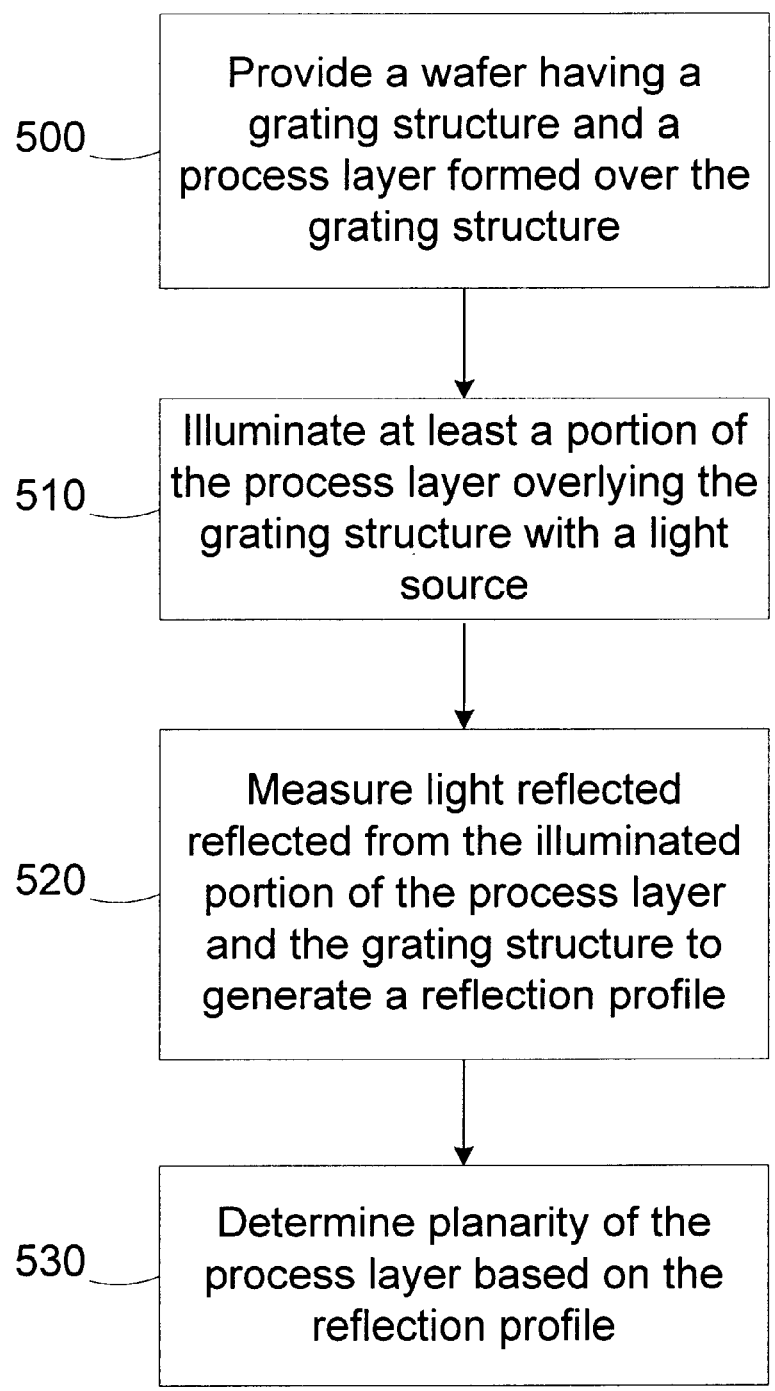
FIG. 5 is a simplified flow diagram of a method for controlling a polishing process in accordance with another illustrative embodiment of the present invention.

FIG. 5 is a simplified flow diagram of a method for controlling a polishing process in accordance with an illustrative embodiment of the present invention. In block 500, a wafer having a grating structure and a process layer formed over the grating structure is provided. In block 510, at least a portion of the process layer overlying the grating structure is illuminated with a light source. In block 520, light reflected from the illuminated portion of the process layer and the grating structure is measured to generate a reflection profile. In block 530, an operating recipe of a polishing tool is modified based on the reflection profile.

Controlling the polishing tool 210 based on feedback from the scatterometry tool 220, as described above, has numerous advantages. The uniformity of the polishing operation may be increased. Decreased planarization variation reduces the likelihood that a wafer requires rework or must be scrapped. Accordingly. the quality of the devices produced on the processing line 200 and the efficiency of the processing line 200 are both increased.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for determining planarity, comprising:
   providing a wafer having a grating structure and a process layer formed over the grating structure;
   illuminating at least a portion of the process layer and the grating structure with a light source;
   measuring light reflected from the illuminated portion of the process layer and the grating structure to generate a reflection profile; and
   determining planarity of the process layer based on the reflection profile.

2. The method of claim 1, wherein determining planarity of the process layer further comprises:
   comparing the generated reflection profile to a library of reference reflection profiles, each reference reflection profile having an associated polishing profile;
   selecting a reference reflection profile closest to the generated reflection profile; and
   determining planarity of the process layer based on the polishing profile associated with the selected reference reflection profile.

3. The method of claim 1, wherein generating the reflection profile comprises generating the reflection profile based on at least one of intensity and phase of the reflected light.

4. The method of claim 1, wherein determining planarity of the process layer further comprises:
   comparing the generated reflection profile to a target reflection profile; and
   determining the planarity of the process layer based on the comparison between the generated reflection profile and the target reflection profile.

5. The method of claim 1, wherein providing the wafer comprises providing the wafer having the grating structure formed in a test structure on the wafer.

6. The method of claim 1, wherein providing the wafer comprises providing the wafer having the grating structure formed in a production device on the wafer.

7. The method of claim 1, further comprising determining at least one parameter of an operating recipe of a polishing tool based on the reflection profile.

8. The method of claim 7, wherein determining at least one parameter of the operating recipe of the polishing tool comprises reducing at least one of a polishing rate and a polishing time of the polishing tool based on the polishing profile corresponding to an overpolish condition.

9. The method of claim 7, wherein determining at least one parameter of the operating recipe of the polishing tool comprises increasing at least one of a polishing rate and a polishing time of the polishing tool based on the polishing profile corresponding to an underpolish condition.

10. A method for determining planarity, comprising:

providing a wafer having a grating structure and a process layer formed over the grating structure;

illuminating at least a portion of the process layer overlying the grating structure with a light source;

measuring light reflected from the illuminated portion of the process layer and the grating structure to generate a reflection profile;

comparing the generated reflection profile to a library of reference reflection profiles, each reference reflection profile having an associated polishing profile;

selecting a reference reflection profile closest to the generated reflection profile; and determining planarity of the process layer based on the polishing profile associated with the selected reference reflection profile.

11. The method of claim 10, further comprising determining at least one parameter of the operating recipe of a polishing tool based on the polishing profile associated with the selected reference reflection profile.

12. A method for polishing wafers, comprising:

providing a wafer having a grating structure and a process layer formed over the grating structure;

illuminating at least a portion of the process layer overlying the grating structure with a light source;

measuring light reflected from the illuminated portion of the process layer and the grating structure to generate a reflection profile;

comparing the generated reflection profile to a target reflection profile; and determining the planarity of the process layer based on the comparison between the generated reflection profile and the target reflection profile.

13. The method of claim 12, further comprising determining at least one parameter of the operating recipe of a polishing tool based on the determined planarity.

14. A processing line, comprising:

means for polishing a wafer based on an operating recipe, the wafer having wafer having a grating structure and a process layer formed over the grating structure;

means for illuminating at least a portion of the process layer overlying the grating structure with a light source;

means for measuring light reflected from the illuminated portion of the process layer and the grating structure to generate a reflection profile; and means for determining planarity of the process layer based on the reflection profile.

15. The processing line of claim 14, further comprising:

means for comparing the generated reflection profile to a library of reference reflection profiles, each reference reflection profile having an associated polishing profile;

means for selecting a reference reflection profile closest to the generated reflection profile; and means for determining the planarity of the process layer based on the polishing profile associated with the selected reference reflection profile.

16. The processing line of claim 14, further comprising:

means for comparing the generated reflection profile to a target reflection profile; and means for determining the planarity of the process layer based on the comparison between the generated reflection profile and the target reflection profile.

* * * * *